(12) United States Patent
Yamada et al.

(10) Patent No.: US 6,479,312 B1
(45) Date of Patent: Nov. 12, 2002

(54) GALLIUM PHOSPHIDE LUMINESCENT DEVICE

(75) Inventors: Masato Yamada, Annaka (JP); Susumu Higuchi, Annaka (JP); Kousei Yumoto, Annaka (JP); Makoto Kawasaki, Annaka (JP); Ken Aihara, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/869,266

(22) PCT Filed: Oct. 27, 2000

(86) PCT No.: PCT/JP00/07530

§ 371 (c)(1),
(2), (4) Date: Jun. 27, 2001

(87) PCT Pub. No.: WO01/33642

PCT Pub. Date: May 10, 2001

(30) Foreign Application Priority Data

Oct. 29, 1999 (JP) .......................... 11-309939

(51) Int. Cl.$^7$ .............................. H01L 21/00
(52) U.S. Cl. .................... 438/46; 257/87; 257/101; 438/46; 438/93; 438/761; 438/767; 438/918
(58) Field of Search ............... 257/79, 87, 101–103; 438/22, 46–48, 57, 73, 93, 94, 438, 478, 503, 507, 761, 763, 767, 918, 962

(56) References Cited

U.S. PATENT DOCUMENTS

| | | | | |
|---|---|---|---|---|
| 4,562,378 A | * | 12/1985 | Tadanobu et al. | 313/499 |
| 5,406,093 A | * | 4/1995 | Endo et al. | 257/101 |
| 5,529,938 A | | 6/1996 | Umeda et al. | |

FOREIGN PATENT DOCUMENTS

| JP | 54-53974 | 4/1979 |
|---|---|---|
| JP | 57-93589 | 6/1982 |
| JP | 6-342935 | 12/1994 |

OTHER PUBLICATIONS

Japanese Patent Office, Japanese Patent Application No. 9–293896, Date Published: Nov. 11, 1997, Application No.: 8–102816, Application Date: Apr. 24, 1996, pp. 1–8.

Japanese Patent Office, Japanese Patent Application No. 8–228023, Date Published: Sep. 3, 1996, Application No.: 7–32345, Application Date: Feb. 21, 1995, pp. 1–5.

Japanese Patent Office, Japanese Patent Application No. 7–326792, Date Published: Dec. 12, 1995, Application No.: 6–117999, Application Date: May 31, 1994, pp. 1–5.

European Patent Office, European Patent Application No. 0 685 892 A2, Date Published: Dec. 6, 1995, Application No. 95303696.9, Date of Filing: May 31, 1995, pp. 1–10.

(List continued on next page.)

Primary Examiner—Michael Sherry
Assistant Examiner—Asok Kumar Sarkar
(74) Attorney, Agent, or Firm—Snider & Associates; Ronald R. Snider

(57) ABSTRACT

By providing a nitrogen-doped low carrier concentration layer 13 having both of a donor concentration and an acceptor concentration controlled below $1\times10^{16}/\text{cm}^3$ at a p-n junction portion between an n-type GaP layer 12 and a p-type GaP layer 14, the luminance of the GaP light emitting device can be improved by as much as 20 to 30% over the conventional one. Suppressing the donor concentration and the acceptor concentration in the low carrier concentration layer 13 below $1\times10^{16}/\text{cm}^3$ inevitably gives a carrier concentration, which is expressed as a difference between both concentrations, lower than $1\times10^{16}/\text{cm}^3$ accordingly. The emission efficiency upon injection of electrons or holes can be improved by suppressing the concentration of the donor which serves as non-emissive center below $1\times10^{16}/\text{cm}^3$ to thereby extend the carrier lifetime; and by concomitantly suppressing the carrier concentration at a level significantly lower than that in the adjacent layers 12 and 14.

23 Claims, 9 Drawing Sheets

OTHER PUBLICATIONS

Japanese Patent Office, Japanese Patent Application No. 6–342935, Date Published: Dec. 13, 1994, Application No.: 5–154168, Application Date: May 31, 1993, pp. 1–5.

European Patent Office, European Patent Application No. 0 631 330 A2, Date Published: Dec. 28, 1994, Application No. 94107563.2, Date of Filing: May 16, 1994, pp. 1–10.

Japanese Patent Office, Japanese Patent Application No. 6–120561, Date Published: Apr. 28, 1994, Application No. 4–285265, Application Date: Sep. 30, 1992, pp. 1–6.

European Patent Office, European Patent Application No. 0 590 649 A1, Date Published: Apr. 6, 1994, Application No. 93115751.5, Date of Filing: Sep. 29, 1993, pp. 1–9.

Japanese Patent Office, Japanese Patent Application No. 1–245569, Date Published: Sep. 29, 1989, Application No.: 63–71898, Application Date: Mar. 28, 1988, pp. 361–365.

Japanese Patent Office, Japanese Patent Application No. 59–80981, Date Published: May 10, 1984, Application No.: 57–192678, Application Date: Nov. 1, 1982, pp. 417–419.

Japanese Patent Office, Japanese Patent Application No. 49–34787, Date Published: Mar. 30, 1974, Application No.: 47–76493, Application Date: Aug. 1, 1972, pp. 409–412.

"Japanese Industrial Standard—Z 8701," Jan. 3, 1995, pp. 122–135., Japanese Standards Association.

Tamotsu Uragaki et al., "Liquid Phase Epitaxial Growth for High–Efficiency GaP Green LED's," *National Technical Report*, Dec. 1979, pp. 1152–1158, vol. 25, No. 6.

* cited by examiner

*low carrier concentration layer (N-doped)

GALLIUM PHOSPHIDE LUMINESCENT DEVICE

FIELD OF THE INVENTION

The present invention relates to a gallium phosphide light emitting device and a method for fabricating thereof, and in more detail, a gallium phosphide light emitting device with a high luminance and a method for fabricating such device.

DESCRIPTION OF THE BACKGROUND ART

Light emitting devices such as light emitting diodes are generally obtained by stacking a plurality of semiconductor layers on a semiconductor substrate to thereby fabricate a multi-layered semiconductor wafer having a p-n junction, and processing such wafer into the devices. Among such devices, those having a dominant emission wavelength (dominant wavelength) within a range from 555 to 580 nm are obtained by stacking on an n-type gallium phosphide (which may simply be noted as "GaP" hereinafter) substrate at least one each of n-type and p-type gallium phosphide layers in this order, and processing the obtained wafer into the devices. A method for determining the dominant emission wavelength (dominant wavelength) is defined by JIS (Japanese Industrial Standard)-Z8701 (1995).

While GaP having no doped nitrogen (N) serving as an emission center can emit a green light with a dominant emission wavelength of 559 nm or longer and shorter than 560 nm, the light emission efficiency is considerably low since the emission is ascribable to indirect transition. Adding nitrogen (N) to such GaP can now significantly increase the light emission efficiency. It has been considered that such increase is mainly contributed by a mechanism mentioned below. That is, N capable of substituting phosphorus (P) in GaP, will become an electrically neutral impurity since N is a group V element same as P. N has, however, a larger electron affinity than P has, so that it can trap a neighboring electron. Such impurity is known as an isoelectronic trap. Once an electron is trapped, Coulomb's force appears and is exerted far beyond to attract a hole, which results in generation of an exciton. Dissipation by recombination of such exciton emits a green to yellow-green light with a dominant emission wavelength between 560 nm and 580 nm, where energy of such light nearly corresponds to the band gap. Light having a wavelength in the above range and in particular between 560 nm and 564 nm is substantially recognized as a green light. It is now generally known that a potential of N relative to an electron is expressed as a narrow and deep short-distance force in the real space, so that a wave function of the electron can extend widely in the momentum space. Such extension of the wave function in the momentum space desirably increases direct transition component with a null wave vector, so as to allow GaP to have a relatively large emission-recombination probability despite of its nature of indirect transition.

FIGS. 9A and 9B respectively show an exemplary sectional constitution and a carrier concentration profile of the individual layers of a conventional GaP light emitting device. As shown in FIG. 9A, the conventional GaP light emitting device has on an n-type GaP single-crystalline substrate 40 an n-type GaP crystallinity improving layer 41, a non-N-doped n-type GaP layer 42, an N-doped n-type GaP layer 43, an N-doped p-type GaP layer 44, and a non-N-doped p-type GaP layer 45 stacked in this order. A p-n junction is formed between the N-doped n-type GaP layer 43 and the N-doped p-type GaP layer 44. The n-type GaP substrate 40 and the n-type GaP layers 41 to 43 are added with silicon (Si) as an n-type dopant, and the p-type GaP layers 44 and 45 with zinc (Zn) as a p-type dopant.

Such constitution of the GaP light emitting device shown in FIG. 9A, having the N-doped p-n junction for composing a light emissive zone allows a higher light emission efficiency and accordingly a higher luminance as compared with a device having no doped N. It should now be noted that luminance refers to brightness per unit area of a light emitting body. Since luminance considerably varies depending on the morphology of the light emitting body or measurement methods, the value will be evaluated on a relative basis in the context of the present invention.

The light emission efficiency of the GaP light emitting device having the N-doped p-n junction portion is, however, still smaller than that, for example, of a GaP: Zn—O red LED, so that it is important to grow a p-n junction made of high-quality crystal having a minimum amount of defects in order to raise the luminance. The N-doped p-type GaP layer 44 is most commonly grown by the so-called impurity compensation process. The process is such that growing the n-type GaP layer 43, adding zinc (Zn) or other acceptors into the gallium solution, and then growing the p-type GaP layer 44 while compensating the donor. The process is advantageous in that allowing formation of the p-n junction portion using a single solution.

It is now noted that liquid-phase growth of the N-doped n-type GaP layer 43 composing the p-n junction requires ammonia gas as an source to be introduced into the growth vessel containing the Si-added gallium solution. On the other hand, growth of the N-doped p-type GaP layer 44 is proceeded by further adding Zn to the above Si-added gallium solution to thereby compensate the donor impurity (Si), and by similarly introducing ammonia gas. Adding N both to the n-type GaP layer 43 and the p-type GaP layer 44 can principally ensure both layers with a probability of light emission. The p-type GaP layer 44 grown by the foregoing impurity compensation process will, however, inevitably has the acceptor concentration higher than the donor concentration in the n-type GaP layer 43, so that the emission from the n-type GaP layer 43 upon hole injection will become dominant.

In the process of the N doping using ammonia gas, Si reacts with ammonia to produce a stable compound to thereby lower the Si content in the gallium solution, which results in lowered Si concentration (donor concentration, accordingly carrier concentration) in the N-doped n-type GaP layer 43 as shown in FIG. 9B. Since a donor that presents in the light emissive zone acts as a non-emissive center, it is important to prevent as much as possible the donor concentration from being lowered, in order to extend a lifetime of the carrier. The foregoing introduction of ammonia gas during the growth of the n-type GaP layer 43 in order to reduce the concentration of Si as a donor is thus advantageous in terms of correspondingly raising the injection efficiency of holes responsible for light emission.

As described in the above, adding N to the GaP layer composing the p-n junction successfully raises the light emission efficiency. Raising the N concentration, however, cause red-shift of the dominant emission wavelength to intensify yellow component, so that it has been difficult to further raise luminance at a stable wavelength.

In addition, while the ammonia gas introduction during the growth of the n-type GaP layer 43 inevitably reduces the Si (donor) concentration, to thereby advantageously raise the injection efficiency of holes responsible for the light emission, this will raise another problem in that the donor concentration of the n-type GaP layer 43 will always vary in association with the concentration of N introduced in a form of ammonia gas and serves as a light emissive center, so that it will become difficult to control the carrier concentration independently from the N concentration.

It is therefore an object of the present invention to solve the foregoing problems and to provide a gallium phosphide light emitting device with a high luminance and a method for fabricating such device.

SUMMARY OF THE INVENTION

A major concept of the present invention resides in that providing a nitrogen-doped low carrier concentration layer having both of a donor concentration and an acceptor concentration controlled below $1\times10^{16}/cm^3$ at a p-n junction portion between an n-type GaP layer and a p-type GaP layer, to thereby raise the luminance by as much as 20 to 30% over the conventional luminance. Such technique has never been tried by the prior art such as growing the p-type GaP layer composing the p-n junction portion by the impurity compensation process, and the present inventors are the first to clarify effects of such technique.

Suppressing the donor concentration and the acceptor concentration in the low carrier concentration layer below $1\times10^{16}/cm^3$ inevitably gives a carrier concentration, which is expressed as a difference between both concentrations, lower than $1\times10^{16}/cm^3$ accordingly. It should now be noted that matters of importance are suppressing the concentration of the donor which serves as a non-emissive center below $1\times10^{16}/cm^3$ to thereby extend the carrier lifetime; and that concomitantly suppressing the carrier concentration at a level significantly lower than that of the adjacent layer, more specifically below $1\times10^6/cm^3$, to thereby raise the emission efficiency upon injection of electrons or holes.

The low carrier concentration layer contains sulfur and carbon as dopants, where controlling the carbon concentration higher than the sulfur concentration ensures the low carrier concentration layer to have a conduction type of "p", by which the light emission upon electron injection becomes dominant. Since mobility of electrons is far larger than that of holes, this ensures a large electron injection efficiency and an improved luminance.

The reason why sulfur is used as an n-type dopant in the low carrier concentration layer is that sulfur has a relatively high vaporizing pressure and thus can readily be removed by vaporization if the inner pressure of the growth vessel is reduced. The sulfur content in the gallium solution can be reduced if the amount of volatilized sulfur is increased by enhancing the evacuation or by continuing the process under reduced pressure for a longer duration. Carbon used as a p-type dopant of the low carrier concentration is supplied through elution from a carbon-made growth vessel. As the temperature of the gallium solution becomes lower, the amount of carbon eluted into the gallium solution becomes fewer. That is, the carbon concentration and sulfur concentration can be controlled independently from N concentration by properly selecting process conditions under reduced pressure or temperature of the gallium solution.

The luminance of the gallium phosphide light emitting device of the present invention varies depending on the thickness of the low carrier concentration layer, which becomes maximum when the thickness is within a range from 3 to 20 μm.

Providing a non-N-doped low carrier concentration layer between an n-type GaP layer and a p-type GaP layer per se is disclosed in Japanese Laid-Open Patent Publication 6-342935. The publication is, however, aimed at fabricating a GaP light emitting device capable of emitting a pure green light (peak wavelength: approx. 555 nm), hence there is no description suggesting a technique for combining such low carrier concentration layer with N doping. Or rather, N doping into the low carrier concentration layer will red-shift the dominant emission wavelength, which is disadvantageous in terms of obtaining a pure green light emission. Thus the prior art disclosed in the above publication essentially lacks a motivation of combining the low carrier concentration layer and N doping.

On the other hand, N doping to an n-type GaP layer is described in National Technical Report Vol. 25, No. 6, p.1152–1158 (1979) and Japanese Laid-Open Patent Publication 54-53974, where both publications deal with a case in which a large amount of n-type dopant remains in the layer to raise the carrier concentration above $1\times10^{16}/cm^3$ and to achieve a conduction type of "n", which cannot improve the emission efficiency to a satisfiable level. At least the publications do not disclose a GaP layer obtained by doping N into a low carrier concentration layer mainly composed of p-type GaP.

Japanese Laid-Open Patent Publication 57-93589 discloses a GaP light emitting diode in which a p-n junction is formed between an n-type GaP layer and a low carrier concentration p-type GaP layer having a carrier concentration lower than that of such n-type GaP layer (that is, a p-type Gap layer added with an impurity as a shallow donor to thereby have a lowered net acceptor concentration). Again such GaP light emitting diode is unsuccessful in obtaining a green light of high luminance, since the low carrier concentration p-type GaP layer (Zn-doped) attains the low carrier density thereof by being added with a shallow donor such as sulfur (S) in a concentration range from approx. $1\times10^{16}/cm^3$ to $3\times10^{17}/cm^3$.

BEST EMBODIMENTS FOR CARRYING OUT THE INVENTION

Embodiments of the present invention will be detailed hereinafter.

(First Embodiment)

Figures 1A, 1B:
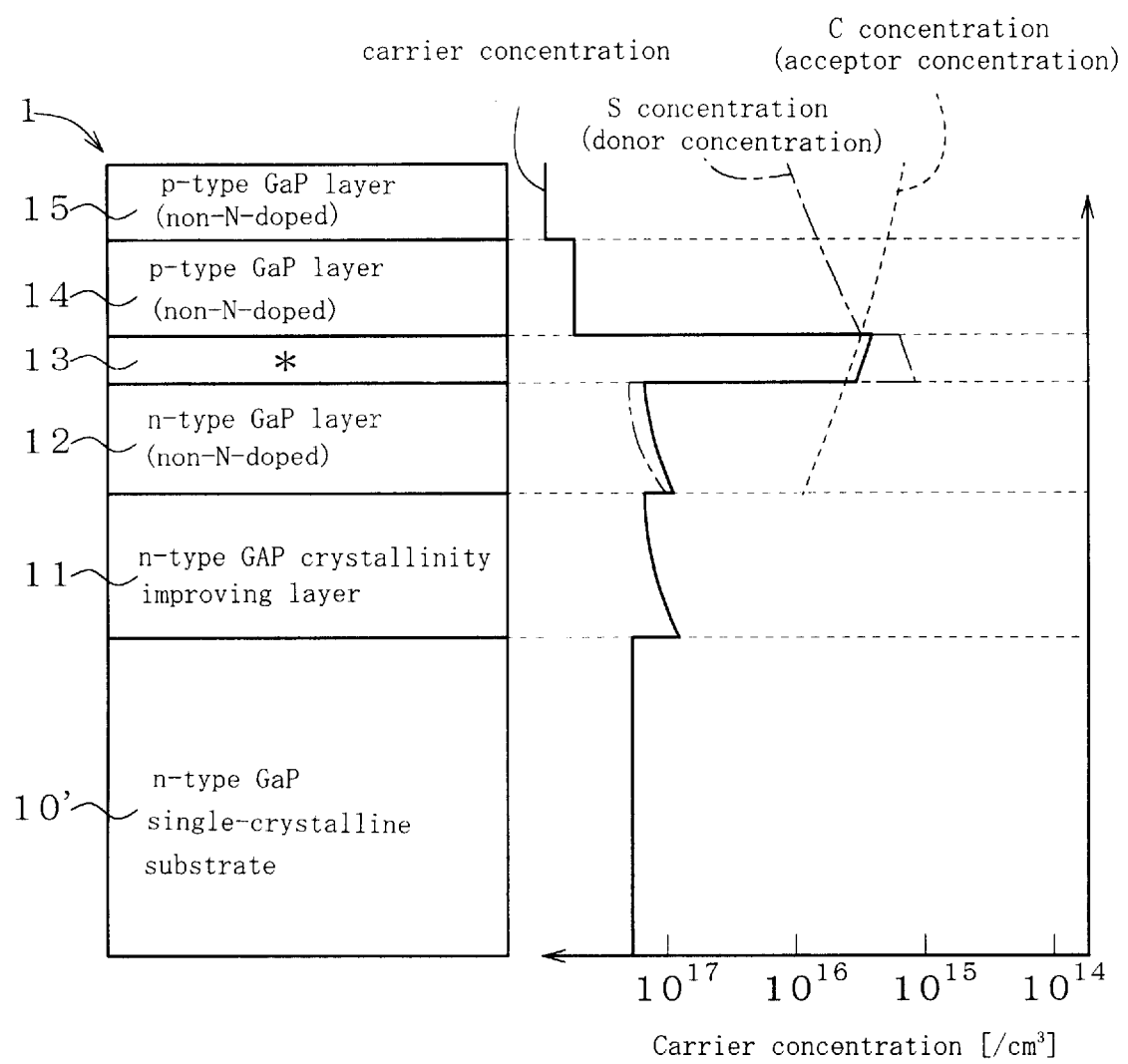
FIGS. 1A and 1B are schematic drawings respectively showing a section and depth profile of the carrier concentration of a GaP light emitting device according to the present invention.

FIGS. 1A and 1B are schematic drawings respectively showing a section and depth profile of the carrier concentration of a GaP light emitting device according to the present invention. For simplicity, FIG. 1A does not show electrodes provided on the "n" terminal and "p" a terminal surfaces.

As shown in FIG. 1A, the GaP light emitting device 1 of the present invention has on an n-type GaP single-crystalline substrate 10, an n-type GaP crystallinity improving layer 11, an n-type GaP layer 12, a low carrier concentration layer 13, and p-type GaP layers 14 and 15 stacked in this order. The n-type GaP single-crystalline substrate 10 and the n-type GaP crystallinity improving layer 11 are added with silicon (Si) as an n-type dopant. On the other hand, the n-type GaP layer 12 is added with sulfur (S) and carbon (C) as impurities (note that the n-type GaP layer 12 in this embodiment is not doped with N).

The low carrier concentration layer 13 is a p-type GaP layer in this embodiment, and forms a p-n junction at the interface with the n-type GaP layer 12. The low carrier concentration layer 13 is added with S and C as dopants, as well as being doped with N, where the concentration of S as a donor and the concentration of C as an acceptor are respectively suppressed below $1 \times 10^{16}/cm^3$, and accordingly also the carrier concentration is suppressed below $1 \times 10^{16}/cm^3$. A majority-minority relation between the S concentration and C concentration in the low carrier concentration layer 13 is inverse to that in the n-type GaP layer 12, and S as an n-type dopant is impurity-compensated with C as a p-type dopant. The thickness of the low carrier concentration layer 13 is selected within a range from 3 to 20 $\mu m$. The p-type GaP layers 14 and 15 are further added with Zn as a p-type dopant, beside S and C, while being not doped with N.

Figure 2:
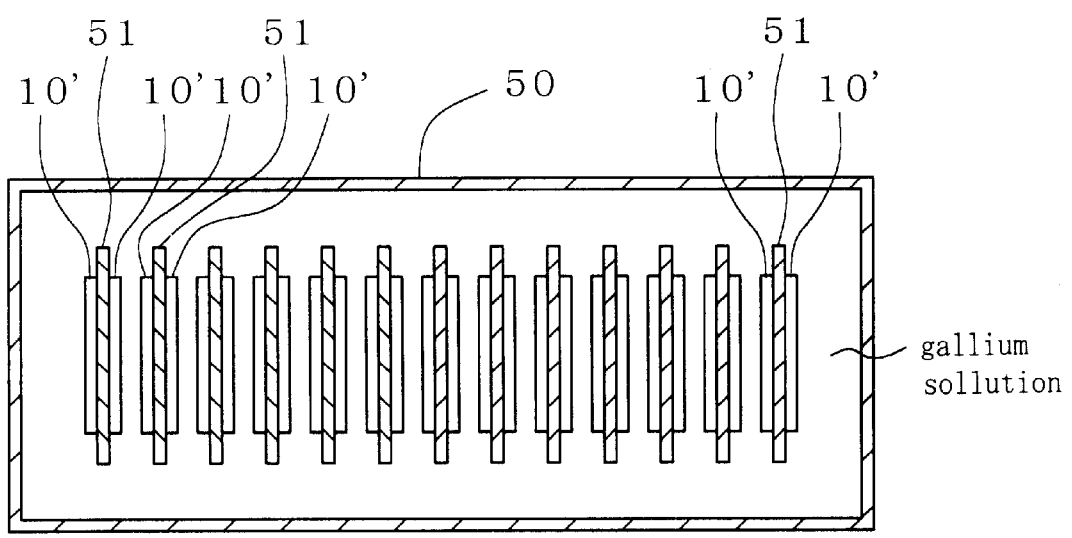
FIG. 2 is a schematic sectional view showing a growth vessel for forming an epitaxial layer on a semiconductor single-crystalline substrate by the liquid phase growth process.

As shown in FIG. 2, the individual layers 11 to 15 are grown on an n-type GaP single-crystalline substrate 10' (where the notation "'" is used for the wafer before diced into chips; a reference numeral 51 represents a substrate holder) by the liquid-phase epitaxial growth process in a gallium solution contained in a carbon-made growth vessel 50.

FIG. 1B shows that the dopants added to the n-type GaP layer 12 and the low carrier concentration layer 13 are S and C, where C is auto-doped from the carbon-made growth vessel 50 (see FIG. 2) into the gallium solution. On the other hand, S is previously dissolved into the gallium solution, and is incorporated together with GaP during the layer growth. In FIG. 1B, the S concentration in the individual layers 11 to 15 is indicated by a dashed line, the C concentration by a broken line, and the carrier concentration expressed as difference between both concentrations by a solid line (effective values were taken into consideration to discuss the impurity concentrations).

In the low carrier concentration layer 13, the S concentration in the layer thereof must be lower than the C concentration in order to ensure conductivity type of "p" of such layer. More specifically, the S concentration of the low carrier concentration layer 13 can be lowered by reducing the pressure within the growth vessel 50 shown in FIG. 2 to thereby vaporize highly volatile S out from the gallium solution. This allows the low carrier concentration layer 13 to be grown from the same solution as used for growing the n-type GaP layer 12. In addition, controlling the degree or duration of the pressure reduction facilitates control of the vaporization amount of S out from the gallium solution, and thus further facilitates control of the S concentration in the low carrier concentration layer 13. Another possible method for lowering the S concentration of the low carrier concentration layer 13 relates to replacing the gallium solution with that having a lower S concentration, rather than reducing the pressure within the vessel (see the third embodiment described later). The low carrier concentration layer 13 is also doped with N, which is accomplished by once reducing the pressure within the growth vessel 50 to vaporize sulfur and then introducing ammonia gas into such vessel 50 (see the second embodiment described later).

Liquid-phase epitaxial growth of the GaP layer can be proceeded by lowering the temperature of the gallium solution and allowing super-saturated GaP to deposit, where the amount of C eluted from the carbon-made growth vessel 50 (see FIG. 2) into the solution reduces as the temperature of the gallium solution descends. While the S concentration in the gallium solution is not affected by the temperature of such solution, a larger amount of S will be incorporated into the GaP layer as the temperature of the solution descends, so that the amount of C incorporated into the GaP layer will relatively decrease as the growth proceeds. Since the carrier concentration means difference between the concentration of S as a donor and the concentration of C as an acceptor, a slight increase in the carrier concentration in association to progress of the growth is observed in the GaP layer 12 as shown in FIG. 1B. The low carrier concentration layer 13 has a sufficiently low concentration of S, to thereby ensure the conductivity type of "p". Since the amount of C incorporated into the GaP layer decreases with the progress of the growth as described previously, the carrier concentration slightly decreases on the contrary.

The p-type GaP layers 14 and 15 can be grown from the gallium solution same as that used for growing the n-type GaP layer 12 or the low carrier concentration layer 13, where supply of C only by the auto-doping from the growth vessel 50 is not sufficient to fulfill a necessary amount of p-type dopant, so that a new p-type dopant, more specifically Zn herein, is added. The liquid-phase epitaxial growth of the p-type GaP layers 14 and 15 can be proceeded by the slow cooling method, where GaP crystal deposited more lately in association with the cooling will have a larger amount of S incorporated therein, so that the S concentration in the p-type GaP layers 14 and 15 slightly increases as the growth proceeds as shown in FIG. 1B.

The low carrier concentration layer 13 has a long lifetime of the carrier, which is contributed by the N doping and the concentration of the donors serve as non-emissive centers suppressed below $1 \times 10^{16}/cm^3$; and has a high injection efficiency of the carrier injected thereto, which is contributed by the carrier concentration (expressed by difference between donor and acceptor concentrations) controlled at a level significantly lower than that of the adjacent layers 12 and 14. Accordingly the emission efficiency is most eminently improved by the synergistic effects of such factors. Further improvement in the luminance will be accomplished by controlling the C concentration so as to be higher than the S concentration to thereby ensure the conductivity type of "p" of the low carrier concentration layer 13 as described in this embodiment, since emission based on injection of electrons, having a larger mobility than holes, will become dominant under such conductivity type.

It is necessary for the p-type GaP layer 14 adjacent to the low carrier concentration layer 13 to have a carrier concentration raised at a certain level so that the layer 14 can fully acts as a supply source of holes which dissipate by recombination within the low carrier concentration layer 13. It is necessary also for the outermost p-type GaP layer 15 on which a metal electrode is formed to have a carrier concentration raised at a certain level from another viewpoint of reducing contact resistance with such electrode (for example by achieving ohmic contact). In one possible measure, a p-type GaP layer having a carrier concentration raised to a level allowing the ohmic contact can be brought into direct contact with the low carrier concentration layer 13. Raising the carrier concentration to a level allowing the ohmic contact may, however, excessively enhance the absorbance of the light, and undesirably lower the luminance. Thus in this embodiment, the p-type GaP layer 15 on which a metal electrode is formed is so designed to have a carrier concentration of $3 \times 10^{17}$ to $1 \times 10^{18}/cm^3$ (approx. $8 \times 10^{17}/cm^3$ typically herein), and a thickness of as small as, for example, approx. 5 to 10 μm. In addition, between the p-type GaP layer 15 and the low carrier concentration layer 13, provided is the p-type GaP layer 14 which has an intermittent carrier concentration of, for example, approx. $1 \times 10^{17}$ to $7 \times 10^{17}/cm^3$ (approx. $5 \times 10^{17}/cm^3$ typically herein), and a thickness larger than that of the p-type GaP layer 15, to thereby successfully achieve both of a function as a hole source, and a function of preventing the light absorption by inserting such p-type GaP layer 14.

In FIGS. 1A and 1B, the n-type GaP single-crystalline substrate 10 typically has a carrier concentration of approx. $2 \times 10^{17}/cm^3$. The n-type GaP crystallinity improving layer 11 typically has a carrier concentration of approx. $8 \times 10^{16}/cm^3$ on the side of the substrate 1, and approx. $1.5 \times 10^{17}/cm^3$ on the side of the n-type GaP layer 12, and has a thickness of approx. 60 μm. The n-type GaP layer 12 typically has a carrier concentration of approx. $8 \times 10^{16}/cm^3$ on the side of the n-type GaP crystallinity improving layer 11, and approx. $1 \times 10^{17}/cm^3$ on the side of the low carrier concentration layer 13, and has a thickness of approx. 100 μm. The low carrier concentration layer 13 typically has a carrier concentration of approx. $8 \times 10^{15}/cm^3$ on the side of the n-type GaP layer 12, and approx. $5 \times 10^{15}/cm^3$ on the side of the p-type GaP layer 14, and has a thickness of approx. 10 μm.

Figure 3:
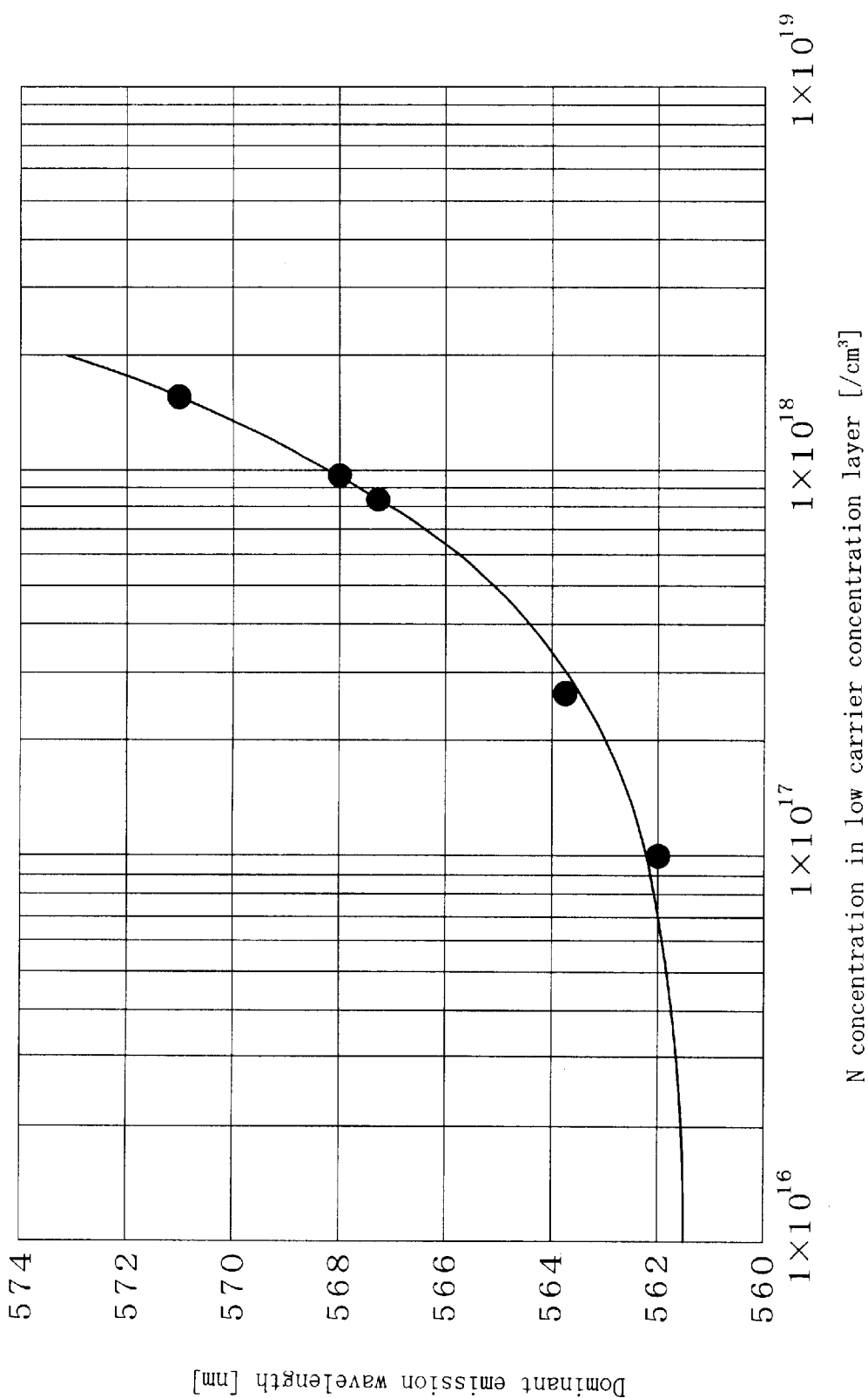
FIG. 3 is a graph showing a relation between N concentration in the low carrier concentration layer shown in FIG. 1A and the dominant emission wavelength of the obtained GaP light emitting device.
Figure 4:
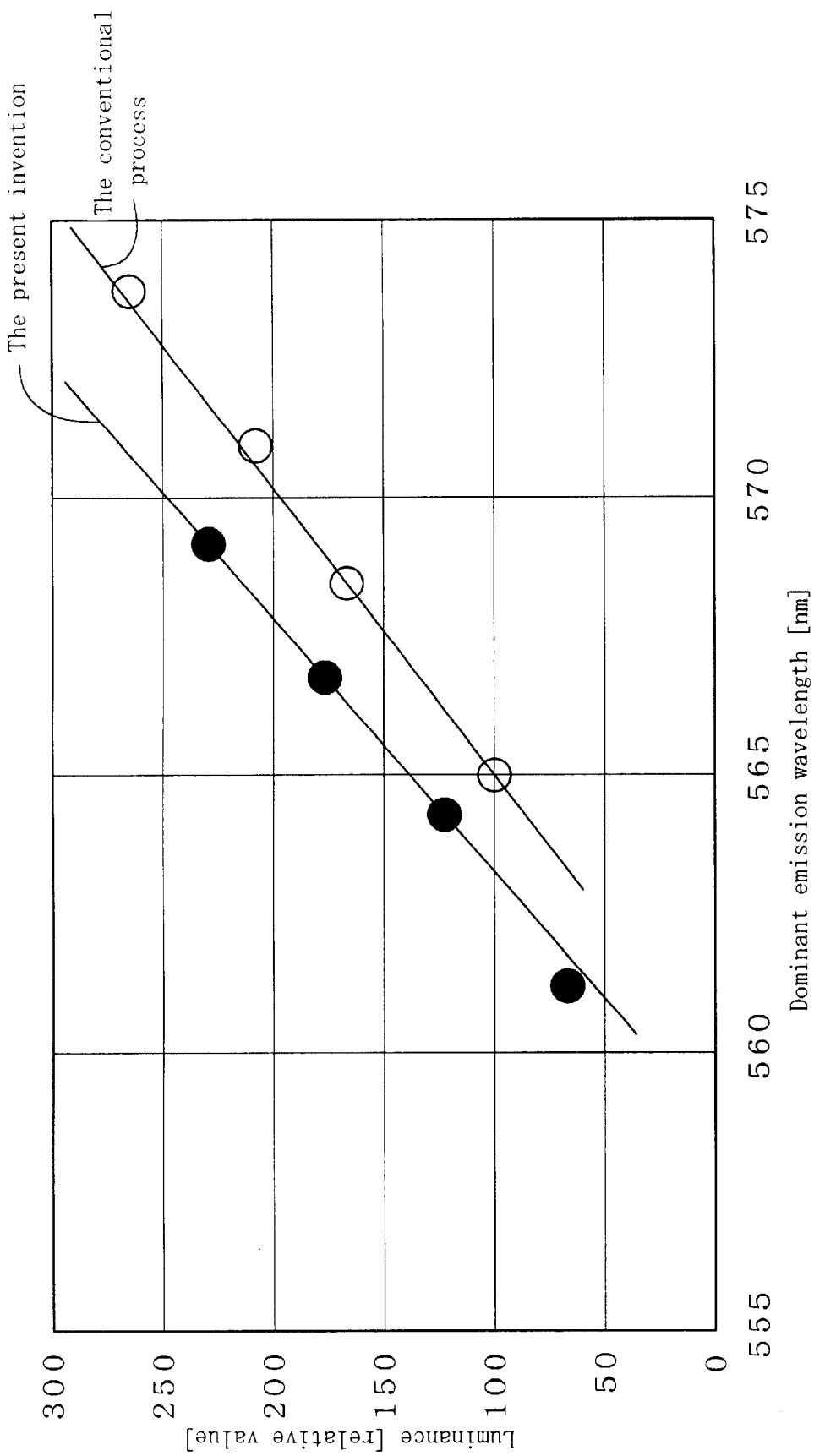
FIG. 4 is a graph showing relations between the dominant emission wavelength shown in FIG. 3 and the luminance of the obtained and a conventional GaP light emitting devices.
Figures 9A, 9B:
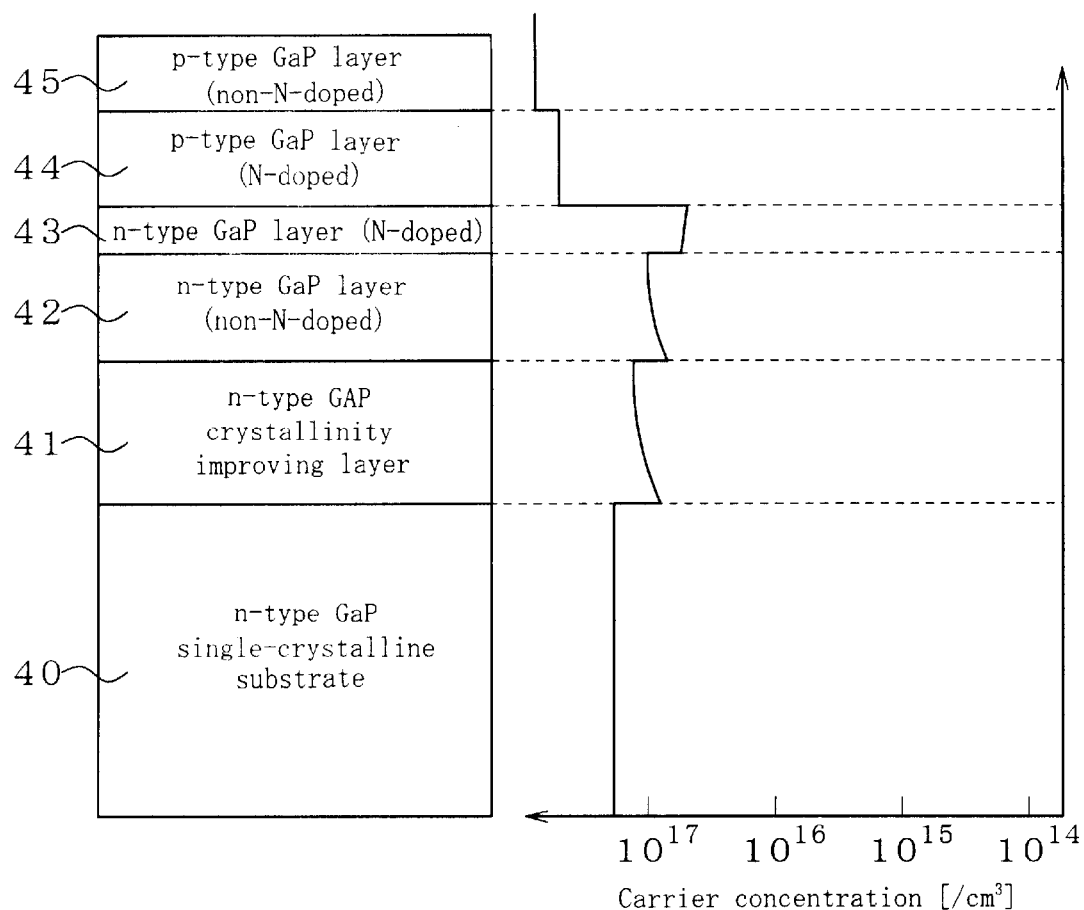
FIGS. 9A and 9B are schematic drawings respectively showing a section and depth profile of the carrier concentration of a GaP light emitting device according to a conventional process.

FIG. 3 shows changes in the dominant emission wavelength of the GaP light emitting device 1 of this embodiment shown in FIGS. 1A and 1B, in relation to the N concentration in the low carrier concentration layer 13. FIG. 4 shows luminance values (relative values) corresponding with the individual dominant emission wavelength. A device chip used herein has a 0.26 mm×0.26 mm square form, and the measurement was carried out at an applied current of 50 mA and at room temperature. Comparison between FIGS. 3 and 4 clearly shows that a higher N concentration results in a higher luminance. It is also known from FIG. 3 that a desirable green to yellowish green emission with a dominant emission wavelength ranging from approx. 562 to 573 nm is obtained in a relatively wide range of the N concentration, more specifically in a range from $1 \times 10^{17}/cm^3$ to $2 \times 10^{18}/cm^3$. FIG. 4 also shows as a comparative embodiment the luminance of a GaP light emitting device shown in FIGS. 9A and 9B, which was fabricated by the conventional process, where the luminance was measured under the same conditions as in the measurement of this embodiment. The results reveal that the present invention is successful in achieving the luminance higher by 20 to 30% than the conventional method in the green to yellowish green emission range.

Figure 5:
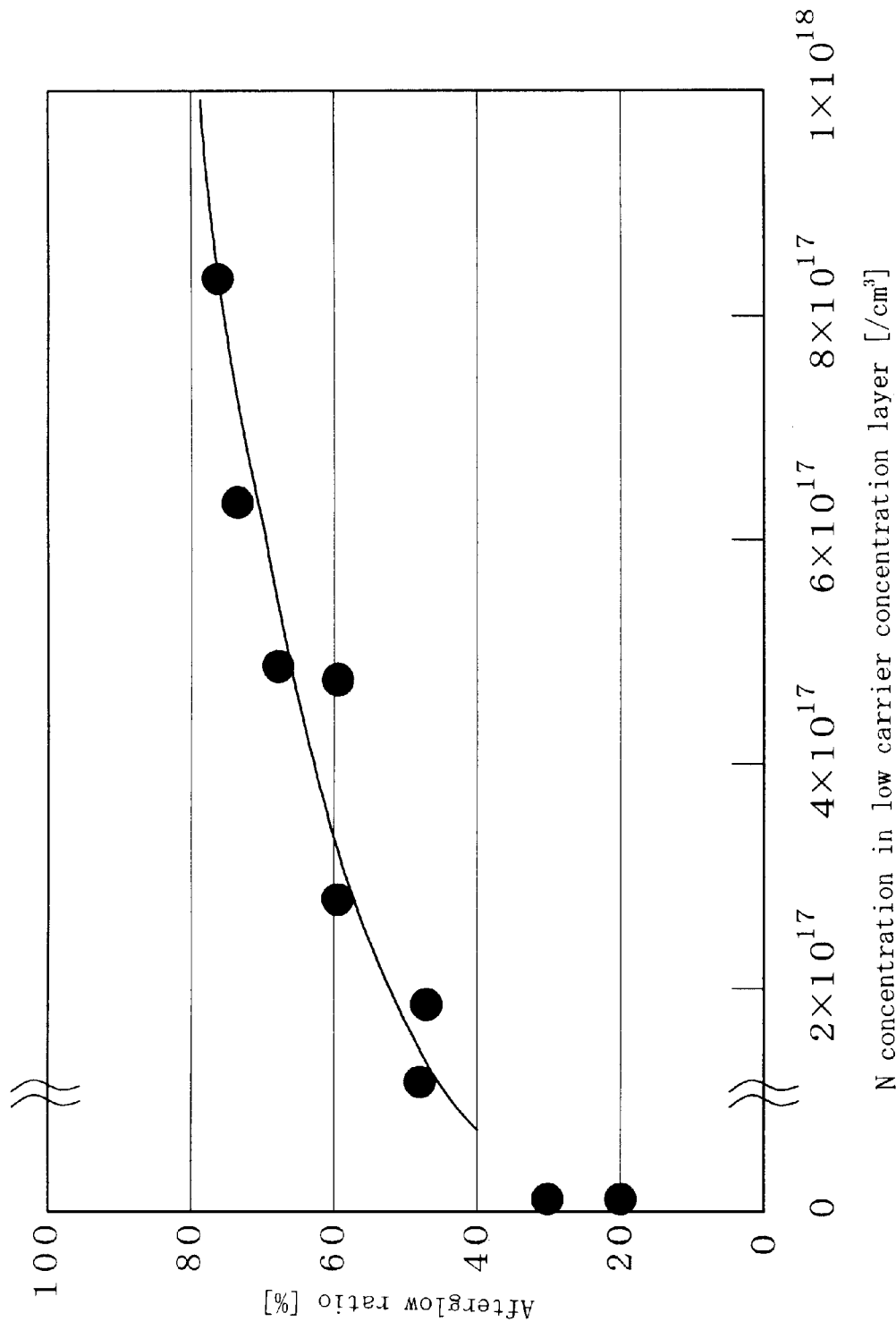
FIG. 5 is a graph showing a relation between N concentration in the low carrier concentration layer shown in FIG. 1A and the afterglow ratio of the obtained GaP light emitting device.

FIG. 5 shows the afterglow ratio of the GaP light emitting device 1 according to this embodiment shown in FIG. 1A in relation to changes in the N concentration in the low carrier concentration layer 13. The afterglow ratio in the context of this embodiment is determined according to an equation $\{(I_0-I_1)/I_0\} \times 100$, where $I_0$ is a luminance measured at the start of 50-mA current supply at room temperature, and $I_1$ is a luminance measured after 100-hour continuous current supply. The results show that N doping eminently improve the afterglow ratio as compared with the case without N doping. In particular, an N concentration of $3 \times 10^{17}/cm^3$ or below yields a dominant emission wavelength of 564 nm or shorter as shown in FIG. 3, where the emitted light is recognized as a green light substantially same as that for a case without N doping. That is, doping N in a minute amount of $3 \times 10^{17}/cm^3$ or below into the low carrier concentration layer 13 can increase the afterglow ratio two-to three-fold as compared with those without N doping as shown in FIG. 5, which markedly extends the lifetime (sustainability of emission luminance) of the light emitting device.

Figure 10:
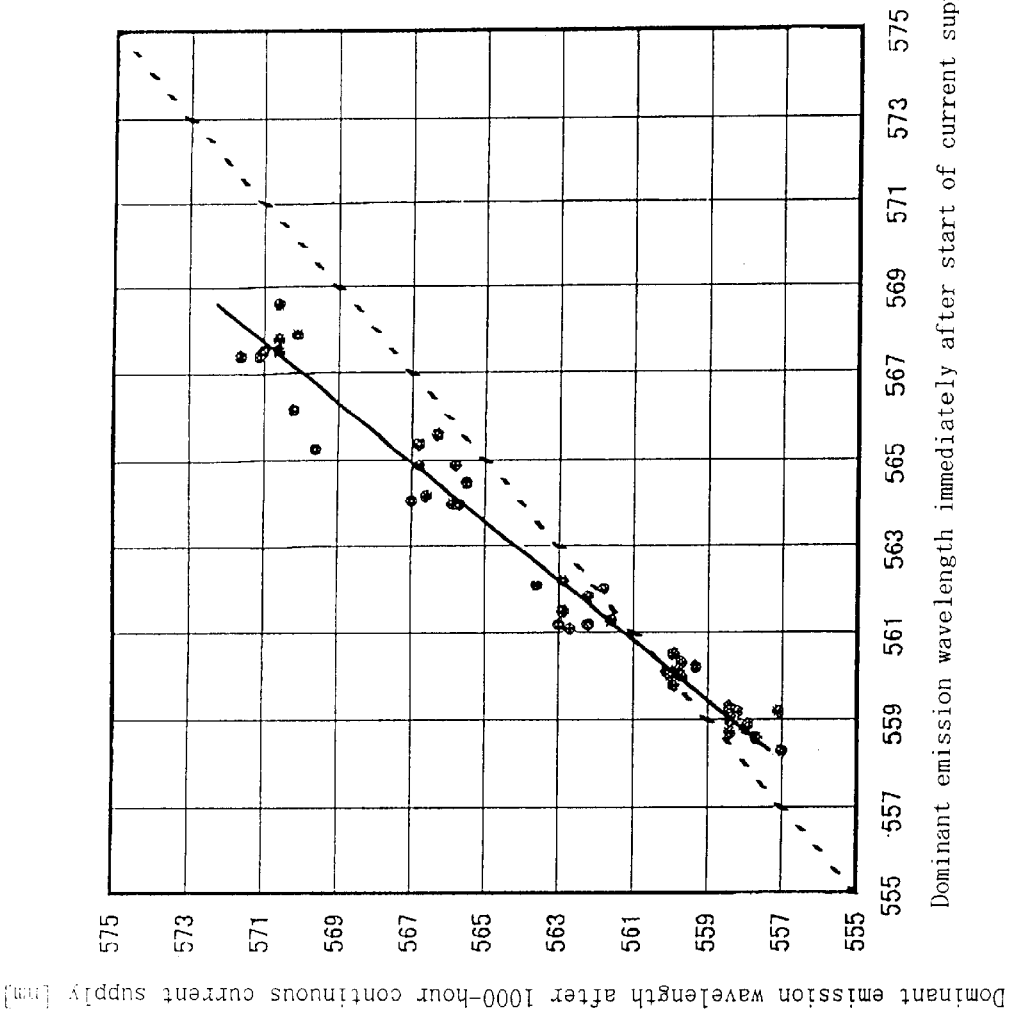
FIG. 10 is a graph showing a relation between the dominant emission wavelengths immediately after current supply and after 1000-hour continuous current supply.

FIG. 10 shows a relation between the dominant emission wavelength immediately after current supply and after 1000-hour continuous current supply with regard to the GaP light emitting device 1 according to this embodiment shown in FIG. 1. It is evident from FIG. 10 that the emission wavelength shows no substantial change even after the 1000-hour continuous current supply with regard to the device with a dominant emission wavelength between 560 and 562 nm. On the contrary, the emission wavelength tends to cause blue-shift for those with a dominant emission wavelength shorter than 560 nm, and to cause red-shift for those with a dominant emission wavelength longer than 562 nm.

To control the dominant emission wavelength within a range from 560 to 562 nm, it is preferable to regulate the ammonia gas to be supplied in a trace during the growth of the low carrier concentration layer 13, to thereby adjust the N concentration in such layer within a range from $3 \times 10^{16}/cm^3$ to $1.5 \times 10^{17}/cm^3$.

In the GaP light emitting device 1 shown in FIGS. 1A and 1B, the n-type GaP layer 12 may be doped with N. Such N doping will also enhance the emission efficiency due to hole injection into the n-type GaP layer 12. On the other hand, it is also allowable to raise the S concentration in the low carrier concentration layer 13 higher than the C concentration insofar as it is lower than $1 \times 10^{16}/cm^3$, which makes the conductivity type of such layer 13 as "n". The p-n junction in this case is formed between such layer 13 and the p-type GaP layer 14, where emission due to hole injection from such layer 14 becomes dominant. Now the carrier concentration in the low carrier concentration layer 13 tends to slightly increase as the growth proceeds.

(Second Embodiment)

Figure 6:
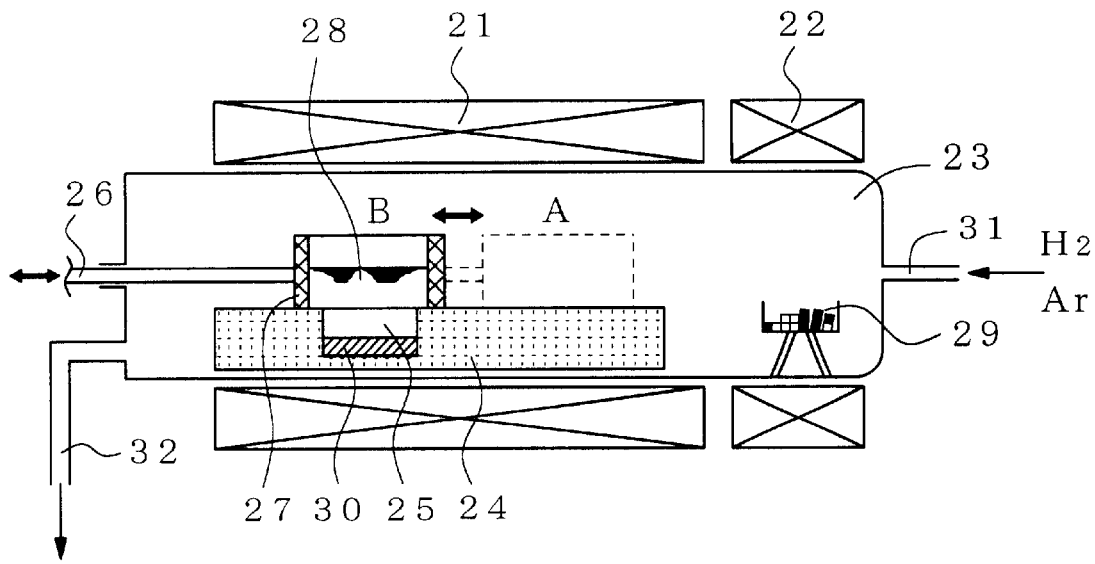
FIG. 6 is a schematic drawing showing an exemplary constitution of a liquid-phase epitaxial growth apparatus used in the second embodiment.

An exemplary method for fabricating the GaP light emitting device 1 shown in FIG. 1A will be described. FIG. 6 shows a typical constitution of a liquid-phase epitaxial growth apparatus used for growing, by the liquid-epitaxial growth method, the individual layers on the GaP single-crystalline substrate 10'. As shown in FIG. 6, in a process tube 23, a carbon-made slide boat 24 (growth vessel) having a wafer chamber 25 for housing a compound semiconductor wafer 30 (the n-type GaP single-crystalline substrate 10' having an epitaxially grown layer formed thereon) is set, and a bottom-opened solution reservoir 27 containing a gallium solution 28 is provided thereon so that it can slide on the slide boat 24 with the aid of a sliding rod 26 (that is, so that the slide boat 24 can slide relative to the gallium solution 28). The gallium solution 28 is dissolved with S as an n-type dopant.

In the process tube 23 and on the side of a carrier gas supply port 31, Zn 29 as a p-type dopant is set. The outer periphery of the process tube 23 is surrounded by a main heater 21 for heating the solution reservoir 27 and around thereof, and a sub heater 22 for heating Zn 29 and around thereof. Through the carrier gas supply port 31, a carrier gas comprising a mixed gas of $H_2$ and Ar is supplied into the process tube 23, which is exhausted from a gas exhaust port 32.

Figure 7:
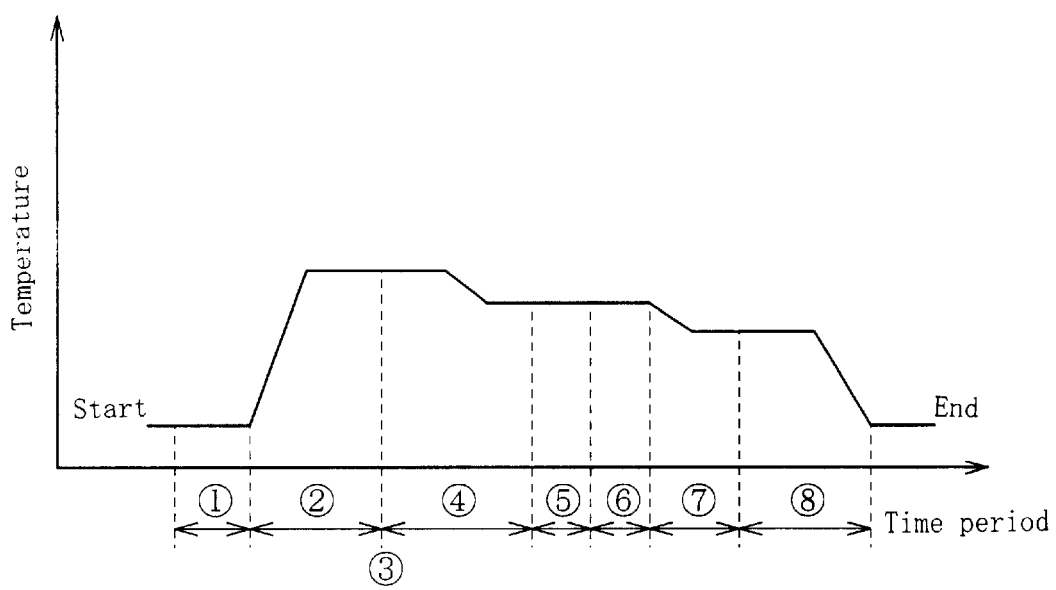
FIG. 7 is a diagram showing an exemplary temperature profile in a liquid-phase growth program employed by the apparatus shown in FIG. 6.

FIG. 7 shows a growth program for growing on the compound semiconductor wafer 30, which comprises the GaP single-crystalline substrate 10' and the n-type GaP crystallinity improving layer 11 formed thereon, the n-type GaP layer (non-N-doped) 12, the low carrier concentration layer 13 (p-type GaP layer, N-doped), the p-type GaP layer 14, and the p-type GaP layer 15 successively in this order. Specific reaction procedures are as follows:

(1) appropriate amounts of Ga melt, polycrystalline GaP and S (sulfur) are placed into the solution reservoir 27, and the solution reservoir 27 is set at position "A" in FIG. 6;

(2) the temperature of the main heater 21 is elevated to heat the solution reservoir 27 at around 1000° C., to thereby allow polycrystalline GaP and S as a dopant to dissolve into the Ga melt and thus prepare the gallium solution 28;

(3) the solution reservoir 27 is slid from position "A" to position "B", the gallium solution 28 is poured into the wafer chamber 25, and the solution reservoir 27 is returned again to position "A";

(4) the temperature of the main heater 21 is lowered at a constant cooling rate, to thereby allow the n-type GaP layer 12 to grow on the compound semiconductor wafer 30;

(5) the pressure in the process tube 23 is reduced (a hundred and several tens Torr to a thousand and several hundreds Torr), to thereby volatilize S as an n-type dopant contained in the gallium solution 28;

(6) the carrier gas ($H_2$, Ar) is supplied together with ammonia gas as an N-doped source;

(7) the temperature of the main heater 21 is lowered only by several to several tens ° C. at a constant cooling rate, while the temperature of the sub heater 22 being remained unchanged, to thereby form the low carrier concentration layer 13 having both of S concentration and C concentration (contributed by auto-doping from the carbon-made slide boat 24) controlled below $1 \times 10^{16}/cm^3$, where the S concentration is lower than the C concentration; and (8) the temperature of the sub heater 22 is elevated to allow Zn 29 to vaporize, and the temperature of the main heater 21 is lowered to a predetermined level at a constant cooling rate to allow the p-type GaP layer 14 to grow, and to further allow the p-type GaP layer 15 to grow, where the temperature of the sub heater 22 during the growth of the p-type GaP layer 15 is set slightly higher so that the layer 15 has a Zn content higher than that in the p-type GaP layer 14.

According to such processes, a light emitting device substrate having a multi-layered structure corresponding to that shown in FIG. 1A is obtained. Then n-electrodes and p-electrodes are formed on the side of the n-type GaP single-crystalline substrate 10' and on the side of the p-type GaP layer 15, respectively, the wafer 30 is diced to produce a number of semiconductor chips. Then each chip is then mounted on a support, attached with lead wires by wire bonding, encapsulated with a resin, to thereby obtain the GaP light emitting device 1.

(Third Embodiment)

Figure 8A:
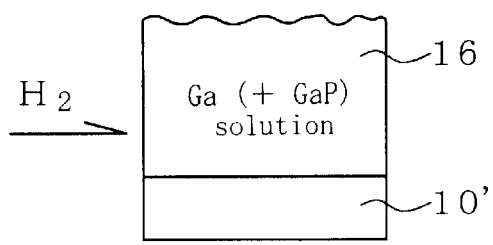
FIGS. 8A to 8H are schematic diagrams for explaining the process in the third embodiment.

In this embodiment, another method for fabricating the GaP light emitting device 1 shown in FIG. 1A will be described referring to process diagrams shown in FIGS. 8A to 8H. First, as shown in FIG. 8A, the gallium solution 16 obtained by dissolving at 1060° C. polycrystalline GaP and Si as an n-type dopant is placed on the n-type GaP single-crystalline substrate 10'. The temperature of a system including the gallium solution 16 is gradually lowered, to thereby allow GaP dissolved in the gallium solution 16 to deposit onto the n-type GaP single-crystalline substrate 10'. Thus the compound semiconductor wafer 30 composed of the n-type GaP single-crystalline substrate 10' and the Si-doped n-type GaP crystallinity improving layer 11 formed thereon is obtained (FIG. 8B).

Figure 8E:
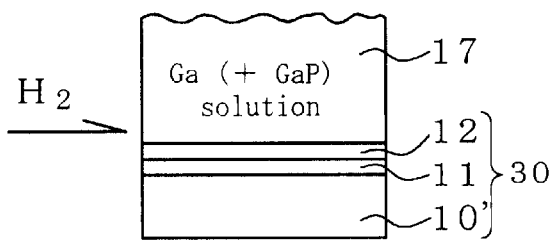
Figure 8B:
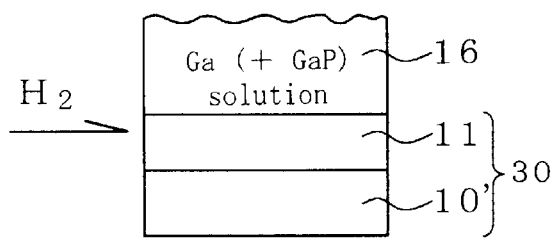
Figure 8F:
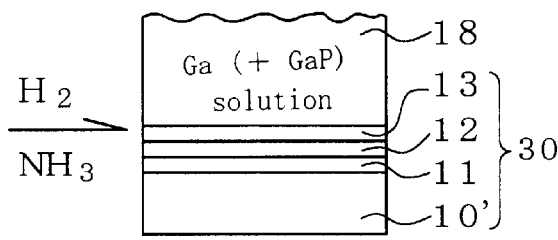
Figure 8C:
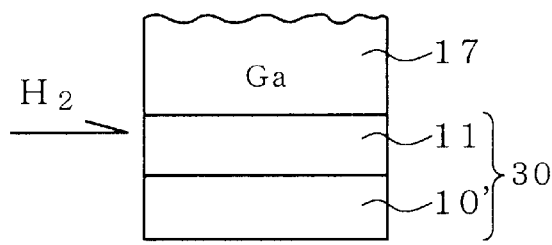
Figure 8G:
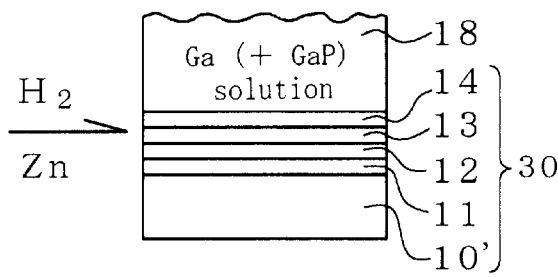
Figure 8D:
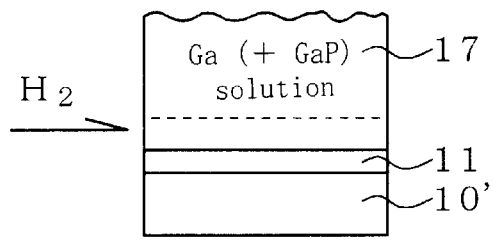
Figure 8H:
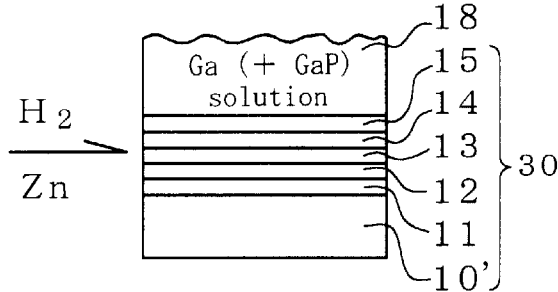

Next, as shown in FIG. 8C, a gallium solution 17 containing S as an n-type dopant dissolved therein at a concentration higher than that in a gallium solution 18 described later is placed on the compound semiconductor wafer 30. The temperature herein is set to 600° C. The temperature of a system including the gallium solution 17 is then elevated to 1000° C. The upper portion of the n-type GaP crystallinity improving layer 11 gradually begins to dissolve into the gallium solution 17, to thereby convert the gallium solution 17 into a saturated GaP solution (gallium solution 17a) at 1000° C. (FIG. 8D).

Next, the temperature is lowered to allow the n-type GaP layer 12 doped with n-type dopants (Si, S) to grow (FIG. 8E). While C is auto-doped into such layer 12 from the carbon-made slide boat housing the compound semiconductor wafer 30, the conductivity type of the layer 12 becomes "n" since C is compensated by S previously added to the gallium solution 17. Next, the compound semiconductor wafer 30 is disconnected from the gallium solution 17, the slide boat is slid and the compound semiconductor wafer 30 is brought into contact with a gallium solution 18 containing a trace of or no S as an n-type dopant under supply of ammonia gas into the growth vessel, and the temperature is then lowered. This allows formation of the low carrier concentration layer 13 having both of S concentration and C concentration (contributed by auto-doping from the carbon-made slide boat) controlled below $1 \times 10^{16}/cm^3$, where the S concentration is lower than the C concentration (FIG. 8F).

Next the ammonia gas supply is stopped, and the temperature of the system having Zn set therein is elevated up to 700° C. or around using a sub heater, not shown, which is followed by cooling of the gallium solution 18. By such process, Zn flows as being carried by $H_2$, and the Zn-doped p-type GaP layer 14 is formed on the low carrier concentration layer 13 (FIG. 8G). The heating temperature by the sub heater is further elevated to thereby grow, on the p-type GaP layer 14, the p-type GaP layer 15 doped with Zn of a higher concentration.

According to the foregoing processes, a light emitting device wafer having a multi-layered structure corresponding to that shown in FIG. 1A is obtained. The wafer is then processed in a similar manner as in the second embodiment, to thereby yield a number of GaP light emitting devices 1.

What is claimed is:

1. A gallium phosphide light emitting device having on a gallium phosphide single-crystalline substrate at least one each of n-type gallium phosphide layer and p-type gallium phosphide layer, wherein a nitrogen-doped low carrier concentration layer having both having both of a donor concentration and an acceptor concentration below $1 \times 10^{16}/cm^3$ is provided at a p-n junction portion adjacent to the n-type gallium phosphide layer and the p-type gallium phosphide layer both of which are not doped with nitrogen.

2. The gallium phosphide light emitting device in accordance with claim 1, wherein the low carrier concentration layer is a p-type gallium phosphide layer.

3. The gallium phosphide light emitting device in accordance with claim 1, wherein the low carrier concentration layer has a carrier concentration controlled below $1 \times 10^{16}/cm^3$.

4. The gallium phosphide light emitting device in accordance with claim 1, wherein the low carrier concentration layer contains sulfur and carbon as dopants.

5. The gallium phosphide light emitting device in accordance with claim 4, wherein a carbon concentration in the low carrier concentration layer is higher than a sulfur concentration.

6. The gallium phosphide light emitting device in accordance with claim 1, wherein a thickness of the carrier concentration layer is within the range of 3 to 20 $\mu$m.

7. The gallium phosphide light emitting device in accordance with claim 1, wherein the low carrier concentration layer has a nitrogen concentration of $3 \times 10^{17}/cm^3$ or below.

8. The gallium phosphide light emitting device in accordance with claim 1, having an emission wavelength of 560 to 562 nm.

9. The gallium phosphide light emitting device in accordance with claim 8, wherein the low carrier concentration layer has a nitrogen concentration within a range from $3 \times 10^{16}/cm^3$ to $1.5 \times 10^{17}/cm^3$.

10. A gallium phosphide light emitting device having on a gallium phosphide single-crystalline substrate at least one each of n-type gallium phosphide layer and p-type gallium phosphide layer, wherein a nitrogen-doped low carrier concentration layer having both of a donor concentration and an acceptor concentration below $1 \times 10^{16}/cm^3$ is provided at a p-n junction portion adjacent to the n-type gallium phosphide layer and the p-type gallium phosphide layer both of which are not doped with nitrogen, wherein the low carrier concentration layer contains sulfur and carbon as dopants, while the carbon concentration is set higher than a sulfur concentration.

11. The gallium phosphide light emitting device in accordance with claim 10, wherein the low carrier concentration layer has a nitrogen concentration of $3 \times 10^{17}/cm^3$ or below.

12. The gallium phosphide light emitting device in accordance with claim 10, having an emission wavelength of 560 to 562 nm.

13. The gallium phosphide light emitting device in accordance with claim 12, wherein the low carrier concentration layer has a nitrogen concentration with a range from $3 \times 10^{16}/cm^3$ to $1.5 \times 10^{17}/cm^3$.

14. A method for fabricating a gallium phosphide light emitting device having on a gallium phosphide single-crystalline substrate at least one each of n-type gallium phosphide layer and p-type gallium phosphide layer, comprising the steps for volatilizing an n-type dopant dissolved in a gallium solution contained in a carbon-made growth vessel, and allowing liquid-phase epitaxial growth to proceed within the gallium solution while supplying ammonia gas into said growth vessel; to thereby form a nitrogen-doped low carrier concentration layer having both of a donor concentration and an acceptor concentration below $1 \times 10^{16}/cm^3$ at a p-n junction portion adjacent to the n-type gallium phosphide layer and the p-type gallium phosphide layer both of which are not doped with nitrogen.

15. The method for fabricating a gallium phosphide light emitting device in accordance with claim 14, wherein the pressure within the growth vessel is reduced so as to suppress a concentration of the n-type dopant incorporated into the low carrier concentration layer lower than a carbon concentration.

16. The method for fabricating a gallium phosphide light emitting device in accordance with claim 14, wherein the n-type dopant contains sulfur.

17. The method for fabricating a gallium phosphide light emitting device in accordance with claim 14, wherein the low carrier concentration layer has a carrier concentration controlled below $1 \times 10^{16}/cm^3$.

18. The method for fabricating a gallium phosphide light emitting device in accordance with claim 14, wherein the ammonia gas is supplied so as to control a nitrogen concentration in said low carrier concentration layer to $3 \times 10^{17}/cm^3$ or below.

19. The method for fabricating a gallium phosphide light emitting device in accordance with claim 18, wherein the nitrogen concentration in said low carrier concentration layer is controlled within a range from $3 \times 10^{16}/cm^3$ to $1.5 \times 10^{17}/cm^3$.

20. A method for fabricating a gallium phosphide light emitting device having on a gallium phosphide single-crystalline substrate at least one each of n-type gallium phosphide layer and p-type gallium phosphide layer, comprising the steps for allowing liquid-phase epitaxial growth to proceed within a gallium solution dissolved with an n-type dopant at a high concentration in a carbon-made slide boat, to thereby grow an n-type gallium phosphide layer on a gallium phosphide single crystalline substrate; disconnecting from said gallium solution a resultant compound semiconductor wafer comprising said gallium phosphide single-crystalline substrate and said n-type gallium phosphide layer grown thereon; sliding said slide boat relative to said gallium solution; and again allowing epitaxial growth to proceed within a gallium solution dissolved with a low concentration of or no n-type dopant while supplying ammonia gas into said growth vessel; to thereby form a nitrogen-doped low carrier concentration layer having both of a donor concentration and an acceptor concentration below $1 \times 10^{16}/cm^3$ at a p-n junction portion adjacent to the n-type gallium phosphide layer and the p-type gallium phosphide layer both of which are not doped with nitrogen.

21. The method for fabricating a gallium phosphide light emitting device in accordance with claim 20, wherein the low carrier concentration layer has a carrier concentration controlled below $1 \times 10^{16}/cm^3$.

22. The method for fabricating a gallium phosphide light emitting device in accordance with claim 20, wherein the ammonia gas is supplied so as to control a nitrogen concentration in said low carrier concentration layer to $3 \times 10^{17}/cm^3$ or below.

23. The method for fabricating a gallium phosphide light emitting device in accordance with claim 20, wherein the nitrogen concentration in said low carrier concentration layer is controlled within a range from $3 \times 10^{16}/cm_3$ to $1.5 \times 10^{17}/cm^3$.

* * * * *

UNITED STATES PATENT AND TRADEMARK OFFICE
CERTIFICATE OF CORRECTION

PATENT NO. : 6,479,312 B1 Page 1 of 1
DATED : November 12, 2002
INVENTOR(S) : Masato Yamada et al.

It is certified that error appears in the above-identified patent and that said Letters Patent is hereby corrected as shown below:

Column 11,
Line 6, after "having both" delete "having both"

Column 12,
Line 64, delete "$3 \times 10^{16}/cm_3$" and substitute therefore -- $3 \times 10^{16}/cm^3$ --

Signed and Sealed this

Twenty-second Day of April, 2003

JAMES E. ROGAN
*Director of the United States Patent and Trademark Office*